(12) United States Patent
Fong

(10) Patent No.: US 6,445,224 B1
(45) Date of Patent: Sep. 3, 2002

(54) REDUCED SHORT CURRENT CIRCUIT

(75) Inventor: Steven K. Fong, Saratoga, CA (US)

(73) Assignee: Ubicom, Inc., Mountain View, CA (US)

( * ) Notice: Subject to any disclaimer, the term of this patent is extended or adjusted under 35 U.S.C. 154(b) by 0 days.

(21) Appl. No.: 09/836,935

(22) Filed: Apr. 17, 2001

Related U.S. Application Data

(60) Provisional application No. 60/262,301, filed on Jan. 16, 2001.

(51) Int. Cl.[7] .................................................. H03K 3/00
(52) U.S. Cl. ........................ 327/108; 327/112; 326/83
(58) Field of Search .......................... 327/108–112, 261, 327/276, 277, 278, 280; 326/81, 82, 83

(56) References Cited

U.S. PATENT DOCUMENTS

| | | | | |
|---|---|---|---|---|
| 5,034,629 A | * | 7/1991 | Kinugasa et al. | 326/30 |
| 5,120,992 A | * | 6/1992 | Miller et al. | 327/111 |
| 5,773,999 A | * | 6/1998 | Park et al. | 327/108 |
| 5,801,558 A | * | 9/1998 | Freyman et al. | 327/112 |

OTHER PUBLICATIONS

Sedra, A.S., Smith, K.C., "MOS Digital Circuits," HRW Series in Electrical Engineering, Holt, Rinehart and Winston, Inc., Microelectronic Circuits, Second Edition, Chapter 15, pp. 844–900, 1987.

* cited by examiner

*Primary Examiner*—Kenneth B. Wells
(74) *Attorney, Agent, or Firm*—Fenwick & West LLP

(57) ABSTRACT

A circuit with reduced short current. A first pair of delay transistors separates a second pair of transistors and prevents short current from flowing through the second pair of transistors.

11 Claims, 13 Drawing Sheets

REDUCED SHORT CURRENT CIRCUIT

RELATED APPLICATION

This application claims priority under 35 U.S.C. §119(e) from U.S. Patent Application serial No. 60/262,301, filed Jan. 16, 2001, which is incorporated by reference in its entirety.

BACKGROUND

A. Technical Field

The present invention relates generally to electronic circuits, and more particularly to short current in standard cell circuits.

B. Background of the Invention

Current circuit design commonly uses standard cell circuits. FIG. 1 is a block diagram of a generalized standard cell circuit 100. Typically, the standard cell circuit 100 includes a pre-driver 104 and a driver 108. An input 102 is coupled to the pre-driver 104. The pre-driver 104 has an output 106 that is coupled to a driver 108. The driver 108 has an output 110.

FIG. 2 shows circuit 200, a specific embodiment of the standard cell circuit 100. In the circuit 200 of FIG. 2, the pre-driver 104 includes a first transistor 202 and a second transistor 204. The input 102 is coupled to the gates of both the first transistor 202 and the second transistor 204. The first transistor 202 is a PMOS transistor and the second transistor 204 is a NMOS transistor. The source of the first transistor 202 is connected to source voltage $V_{DD}$, and the source of the second transistor 204 is connected to ground GND. The drain of the first transistor 202 is connected to the drain of the second transistor 204, and both drains are coupled to the pre-driver output 106.

The driver 108 includes a third transistor 206 and a fourth transistor 208. The gates of the third transistor 206 and the fourth transistor 208 are connected to the pre-driver output 106. The third transistor 206 is a PMOS transistor and the fourth transistor 208 is a NMOS transistor. The source of the third transistor 206 is connected to source voltage $V_{DD}$, and the source of the fourth transistor 208 is connected to ground GND. The drain of the third transistor 206 is connected to the drain of the fourth transistor 208. Both the drain of the third transistor 206 and the drain of the fourth transistor 208 are connected to the output 110.

In operation, the circuit 200 shown in FIG. 2 has a short current $I_S$. This short current $I_S$ is undesirable because it increases power consumption and produces ground noise.

FIG. 3 shows the circumstances where short current $I_S$ occurs in the circuit 200 of FIG. 2. FIG. 3(a) is a graph of the input 102 voltage ("$V_{IN}$") as a function of time. $V_{IN}$ starts low ("$V_{LOW}$"). When $V_{IN}$ is at $V_{LOW}$, the first transistor 202 is on and the second transistor 204 is off. At a first time 302, $V_{IN}$ begins to transition to high ("$V_{HIGH}$"). At a second time 304, $V_{IN}$ is high enough so that the second transistor 204 begins to turn on. At the second time 304, the first transistor 202 has not turned off. Therefore, since both transistors are at least partially on, current flows directly from the source voltage $V_{DD}$ to the ground GND, resulting in the short current $I_S$.

FIG. 3(b) is a graph of short current as a function of time. As shown in FIG. 3(b), the short current begins to rise at time 304. As $V_{IN}$ continues to transition to $V_{HGH}$, short current $I_S$ continues to flow, peaking at time 306. Finally, at time 308, $V_{IN}$ is high enough (as shown in FIG. 3(a)) for the first transistor 202 to turn off. At this point the short current $I_S$ no longer can flow. At time 310, $V_{IN}$ finishes transitioning to $V_{HIGH}$.

A similar process happens when $V_{IN}$ transitions from $V_{HIGH}$ to $V_{LOW}$. As shown in FIG. 3(a), between times 310 and 312, $V_{IN}$ is at $V_{HIGH}$. When $V_{IN}$ is at $V_{HIGH}$, the first transistor 202 is off and the second transistor 204 is on. At time 312, $V_{IN}$ begins to transition to $V_{LOW}$. At time 314, $V_{IN}$ is low enough for the first transistor 202 to begin to turn on, and the input is not low enough for the second transistor 204 to have turned off. Therefore, both transistors are again at least partially on, so current flows directly from the source voltage $V_{DD}$ to the ground GND, resulting in the short current $I_S$.

As shown in FIG. 3(b), the short current begins to rise at time 314, as the first transistor 202 has begun to turn on and before the second transistor 204 has turned off. As $V_{IN}$ continues to transition low, short current $I_S$ continues to flow, peaking at time 316. Finally, at time 318, $V_{IN}$ is low enough (as shown in FIG. 3(a)) for the second transistor 204 to turn off. At this point the short current $I_S$ no longer can flow. At time 50, $V_{IN}$ finishes transitioning to $V_{LOW}$.

FIGS. 4(a) through 4(d) show other standard cell circuits that suffer the disadvantages of short current $I_S$ during operation.

In FIG. 4(a), the circuit 400 is an AND circuit. The AND circuit 400 has a first input 402 and a second input 404. The first input 402 is coupled to the gates of a pair of transistors 412 and 414. Transistor 412 is a NMOS transistor and transistor 414 is a PMOS transistor. The second input 404 is coupled to the gates of a pair of transistors 416 and 418. Transistor 416 is a NMOS transistor and transistor 418 is a PMOS transistor. Transistors 414 and 418 are connected to source voltage $V_{DD}$ and to a pre-driver output 406. Transistor 416 is connected to ground GND and transistor 412, which is in turn connected to the pre-driver output 406. The pre-driver output 406 is connected to the gates of transistors 408 and 410. Transistor 408 is also connected to source voltage $V_{DD}$ and to the output 420. Transistor 410 is also connected to ground GND and to the output 420.

The AND circuit 400 of FIG. 4(a) is affected by short current $I_S$, just as the do circuit 200 of FIG. 2. For example, the pre-driver output 406 transitions between $V_{HIGH}$ and $V_{LOW}$ during use of the AND circuit 400. When such a transition occurs, transistors 408 and 410 are simultaneously on for a period of time, allowing short current $I_S$ to flow, as explained above in the discussion of FIGS. 3(a) and 3(b).

In FIG. 4(b), the circuit 430 is an OR circuit. The OR circuit 430 has a first input 432 and a second input 434. The first input 432 is coupled to the gates of a pair of transistors 442 and 444. Transistor 442 is a NMOS transistor and transistor 444 is a PMOS transistor. The second input 434 is coupled to the gates of a pair of transistors 446 and 448. Transistor 446 is a NMOS transistor and transistor 448 is a PMOS transistor. Transistor 444 is connected to source voltage $V_{DD}$ and to transistor 448, which is in turn connected to a pre-driver output 436. Transistors 442 and 446 are connected to ground GND and to pre-driver output 436. The pre-driver output 436 is connected to the gates of transistors 438 and 440. Transistor 438 is also connected to source voltage $V_{DD}$ and to the output 450. Transistor 440 is also connected to ground GND and to the output 450.

The OR circuit 430 of FIG. 4(b) is affected by short current $I_S$, just as the circuit 200 of FIG. 2. For example, the pre-driver output 436 transitions between $V_{HIGH}$ and $V_{LOW}$ during use of the OR circuit 430. When such a transition occurs, transistors 438 and 440 are simultaneously on for a period of time, allowing short current $I_S$ to flow, as explained above in the discussion of FIGS. 3(a) and 3(b).

FIGS. 4(c) and 4(d) are a schematic diagram of a D latch 460. The D latch 460 has two inputs, a data input 462 and a clock input 480, and two outputs, $Q_1$ and $Q_2$. The clock input 480 is shown in FIG. 4(d). The portion of the D latch 460 shown in FIG. 4(d) receives the clock input 480 and produces outputs $C_1$ and $C_2$, which are connected to the rest of the D latch 460 at the locations shown in FIG. 4(c).

The D latch 460 of FIGS. 4(c) and 4(d) is affected by short current $I_S$, just as the circuit 200 of FIG. 2. For example, there are numerous transistor pairs 464, 466, 468, 470, 472, 474, and 476 in the D latch. In each of these transistor pairs 464, 466, 468, 470, 472, 474, and 476, the gates of the transistors are connected together. When the voltage at the gates transitions between $V_{HIGH}$ and $V_{LOW}$ during operation of the D latch 460, short current $I_S$ will flow through the transistor pairs 464, 466, 468, 470, 472, 474, and 476, as explained above in the discussion of FIGS. 3(a) and 3(b).

FIG. 5 is a block diagram of a previous circuit 500 without the short current problem. The input 502 is coupled to delay 504 and logic 506 circuits. The delay 504 and logic 506 circuits are employed to produce non-overlapping signals driving the gates of the transistors 510 and 512. Transistors 510 and 512 of the circuit 500 of FIG. 5 are analogous to transistors 206 and 208 of the circuit 200 of FIG. 2, which have the problem of short current $I_S$. Since the signals driving the gates of transistors 510 and 512 do not overlap, the transistors 510 and 512 are not both on at any one time, which prevents short current from flowing. Thus, the circuit 500 of FIG. 5 does not have the problem of short current $I_S$. However, the delay 504 and logic 506 circuits of FIG. 5 consume additional power, take up space, and add expense to the circuit.

What is needed is a circuit that reduces short current during operation and does not greatly increase the size or expense over the conventional circuit.

SUMMARY OF THE INVENTION

The present invention is a reduced short current circuit that does not greatly increase the size and expense of the circuit over a conventional circuit. A first delay transistor and a second delay transistor are connected to a first transistor and a second transistor to prevent short current through the first and second transistors.

In one embodiment, the first transistor is a PMOS transistor, with its source connected to a source voltage. The second transistor is an NMOS transistor, with its source connected to ground. The first delay transistor is a PMOS transistor, with its source connected to the drain of the first transistor and its drain connected to the drain of the second transistor. The second delay transistor is an NMOS transistor, with its drain connected to the drain of the first transistor and its source connected to the drain of the second transistor. The gates of the first transistor, the second transistor, the first delay transistor, and the second delay transistor are connected together.

In another embodiment, the first transistor is a PMOS transistor, with its source connected to a source voltage. The second transistor is a NMOS transistor, with its source connected to ground. The drain of the first transistor is connected to the drain of the second transistor. The first delay transistor is a PMOS transistor, with its source connected to the gate of the first transistor and its drain connected to the gate of the second transistor. The second delay transistor is a NMOS transistor, with its drain connected to the gate of the first transistor and its source connected to the gate of the second transistor.

DETAILED DESCRIPTION OF THE PREFERRED EMBODIMENTS

A preferred embodiment of the present invention is now described with reference to the figures where like reference numbers indicate identical or functionally similar elements. Also in the figures, the left most digit of each reference number corresponds to the figure in which the reference number is first used.

The present invention is a circuit that solves the above identified problems. Specifically, the present invention reduces short current in circuits and does not greatly increase the size or cost of the circuit.

The present invention overcomes the limitations of conventional circuits by adding delay transistors to prevent short current. The other, non-delay, transistors in the circuit are reduced in size by approximately the size of the delay transistors, enabling the reduced short current circuit to avoid greatly increasing in cost or size over conventional circuits.

Figure 1:
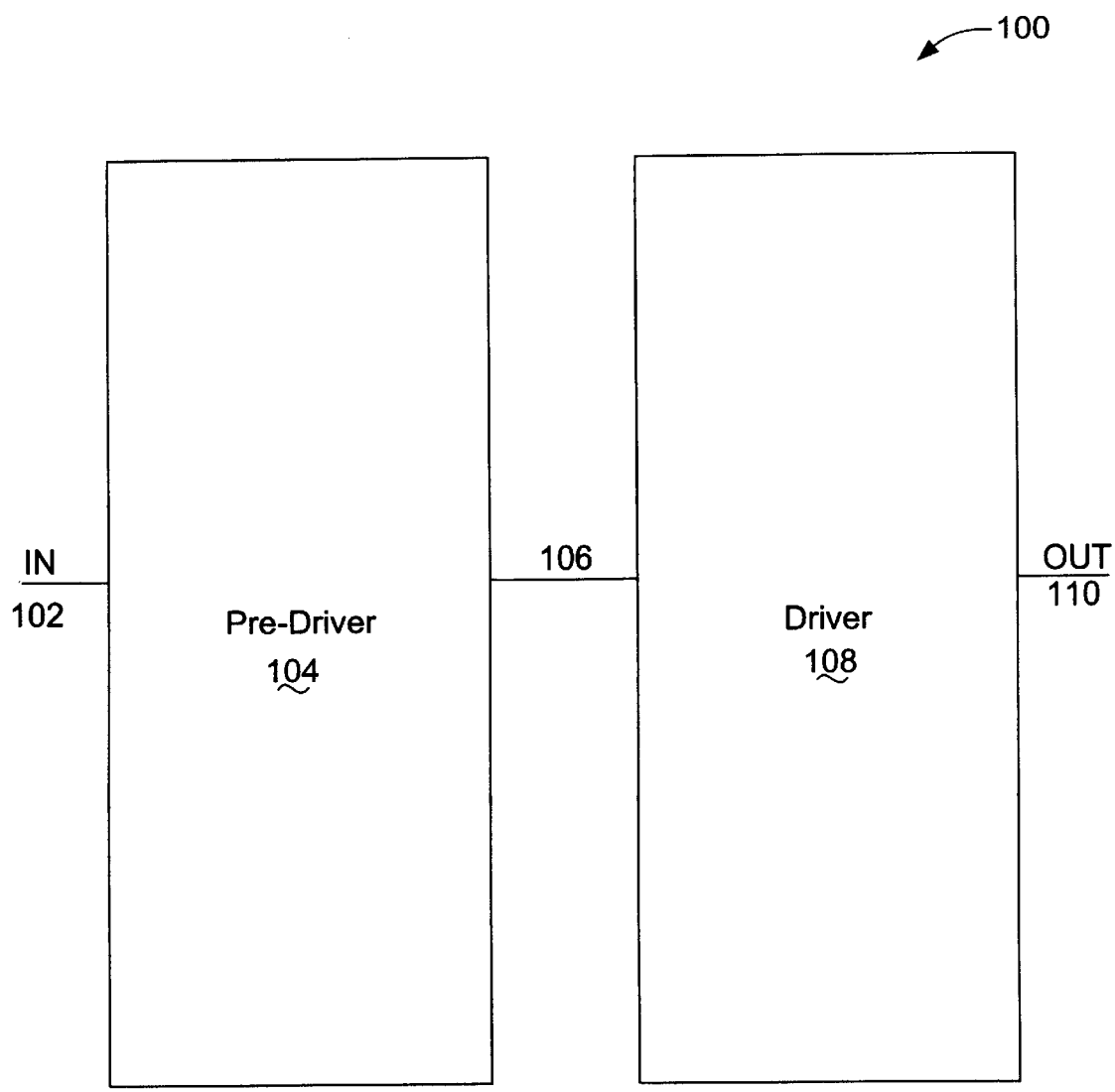
FIG. 1 is a block diagram of a generalized standard cell circuit.
Figure 6:
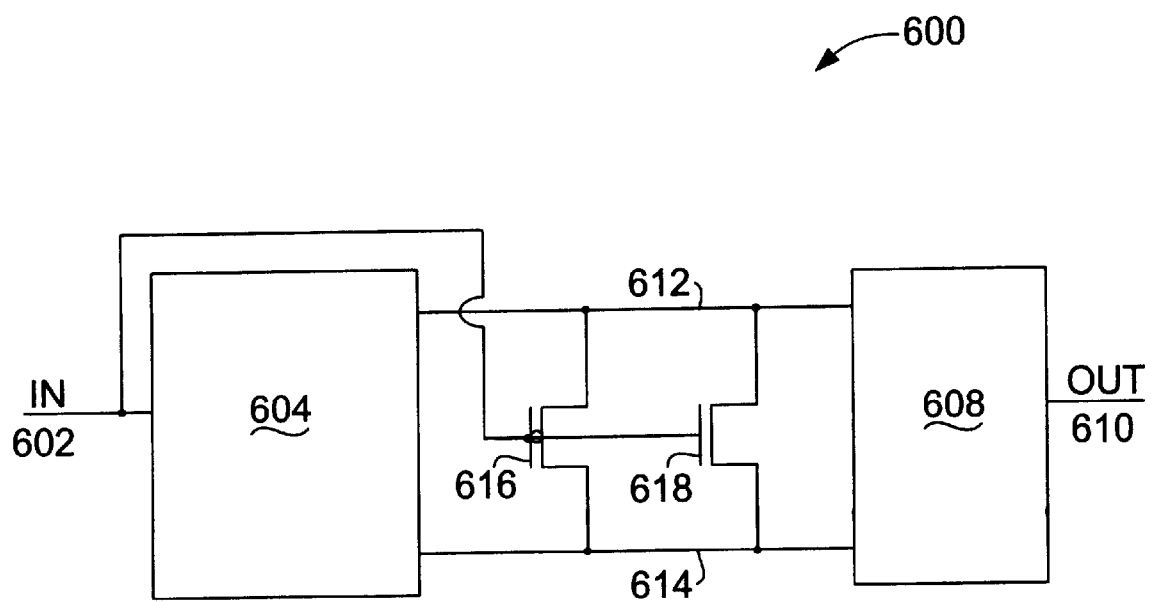
FIG. 6 is a diagram of a generalized cell circuit with reduced short current.

FIG. 6 is a diagram of a generalized cell circuit 600 according to an embodiment of the present invention. The circuit 600 of FIG. 6 is similar to the generalized cell circuit 100 seen in FIG. 1, but provides the advantage of reducing short current. Like circuit 100 of FIG. 1, circuit 600 of FIG. 6 has an input 602 connected to a pre-driver 604, a driver 608 connected to the pre-driver 604, and an output 610 connected to the driver 608. However, whereas the circuit 100 of FIG. 1 has one pre-driver output 106, the pre-driver 604 of circuit 600 of FIG. 6 has two pre-driver outputs: a first pre-driver output 612, and a second pre-driver output 614. Since there are two pre-driver outputs 612 and 614, both the pre-driver 604 and the driver 608 of the circuit 600 of FIG. 6 are also different than the pre-driver 104 and the driver 108 of the circuit 100 of FIG. 1.

The circuit 600 of FIG. 6 includes two delay transistors 616 and 618 connected to the input 602 and between the pre-driver outputs 612 and 614. In one embodiment, the first delay transistor 616 is a PMOS transistor and the second delay transistor 618 is an NMOS transistor. The gates of the delay transistors 616 and 618 are connected to the input 602. The source of the first delay transistor 616 and the drain of the second delay transistor 618 are connected to the first pre-driver output 612. The drain of the first delay transistor 616 and the source of the second delay transistor 618 are connected to the second pre-driver output 614.

The addition of the two transistors 616 and 618 coupled to the input 602 and between the first and second pre-driver outputs 612 and 614 causes a delay between the voltage transitions of the first and second pre-driver outputs 612 and 614. This delay reduces short current in both the pre-driver 604 and the driver 608.

Figure 2:
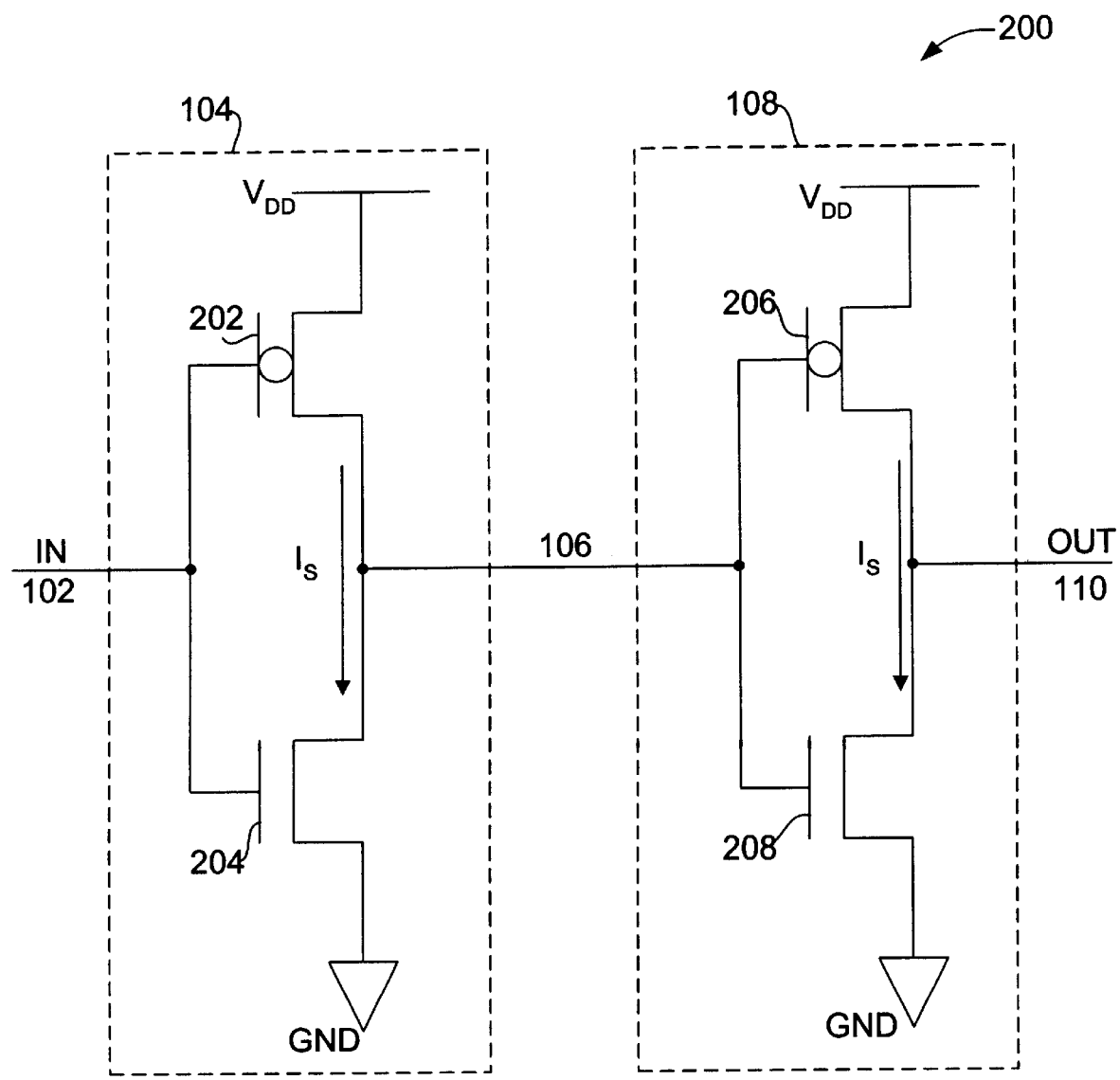
FIG. 2 is a schematic of an example standard cell circuit.
Figure 3A:
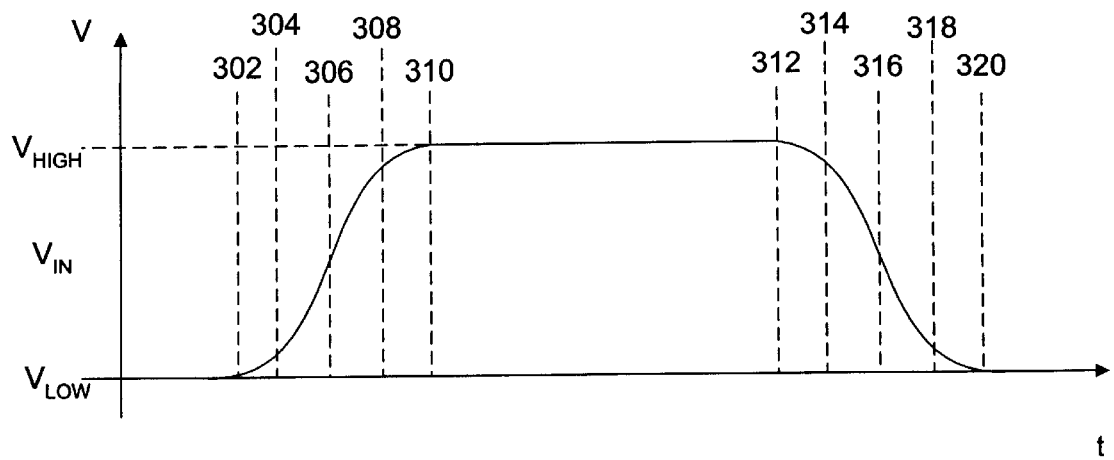
FIG. 3(a) is a graph of input voltage as a function of time.
Figure 3B:
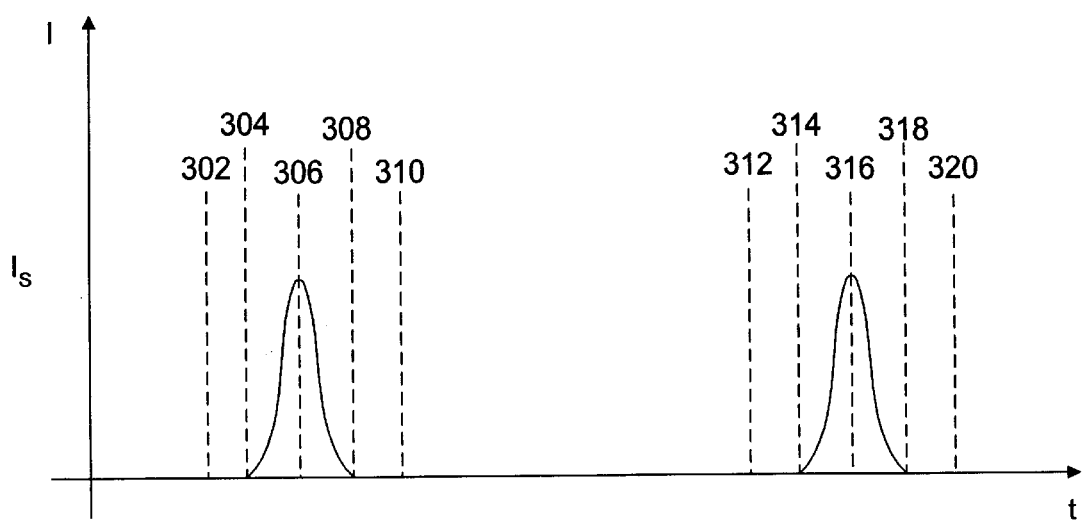
FIG. 3(b) is a graph of short current as a function of time.
Figure 7:
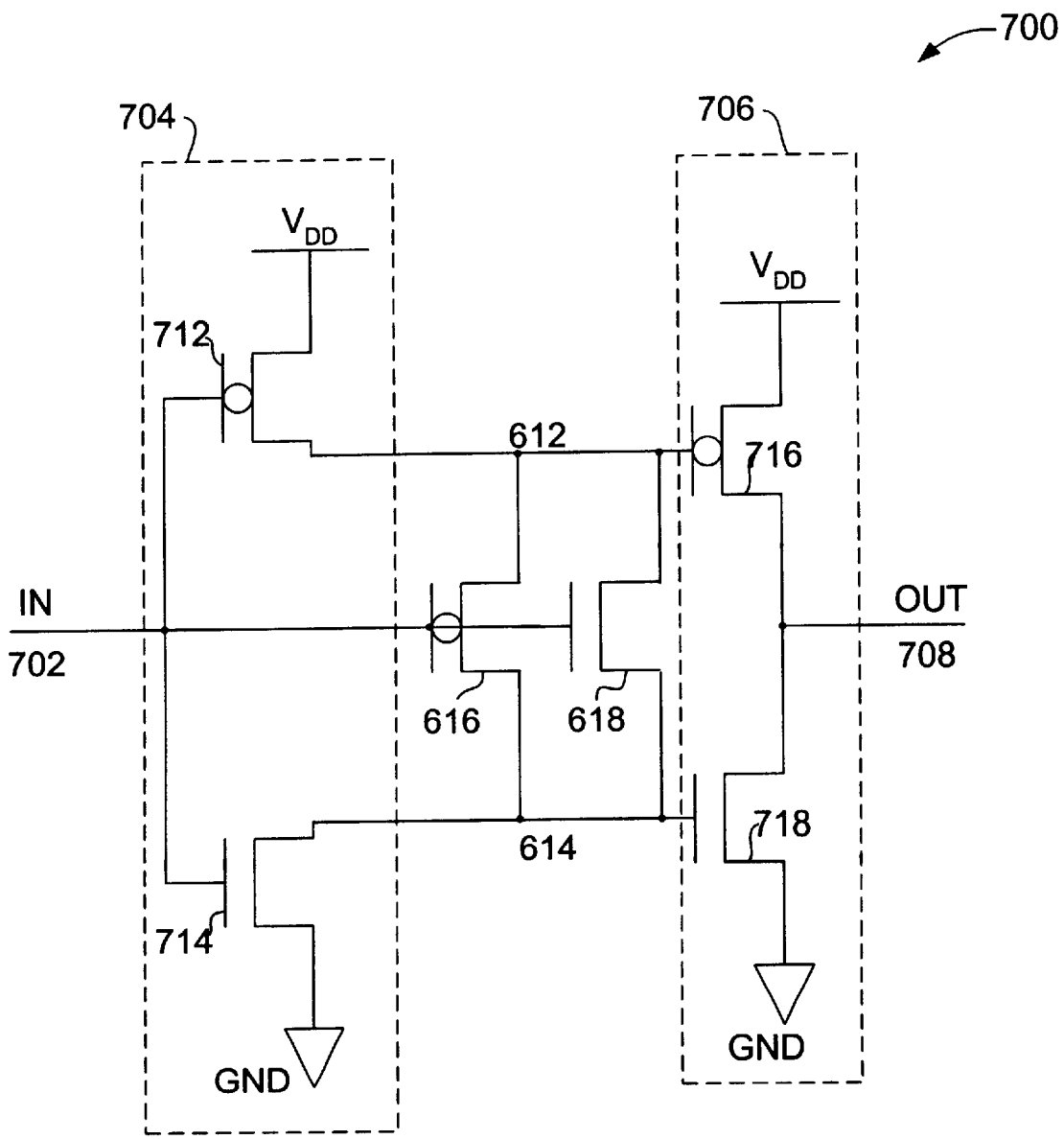
FIG. 7 is a schematic diagram of one embodiment of the invention.

FIG. 7 is a schematic diagram of one embodiment of the invention. This embodiment further illustrates the reduced short current circuit. The circuit 700 of FIG. 7 shows how the circuit 200 of FIG. 2 is modified according to the principles of the invention, as discussed with regard to FIG. 6, to prevent short current $I_S$. The circuit 700 of FIG. 7 performs the same function as the circuit 200 of FIG. 2, without the disadvantage of short current. Thus, the circuit 700 of FIG. 7 may be used to replace circuit 200 of FIG. 2 in applications.

The circuit 700 of FIG. 7 includes an input 702 connected to the gates of a first transistor 712 and a second transistor 714. The first transistor 712 is a PMOS transistor, with the source of the first transistor 712 being connected to source voltage $V_{DD}$. The second transistor 714 is an NMOS transistor, with the source of the second transistor 714 being connected to ground GND. The drain of the first transistor 712 is connected to the first pre-driver output 612, and the drain of the second transistor 714 is connected to the second pre-driver output 614.

The first and second delay transistors 616 and 618 are connected between the first and second pre-driver outputs 612 and 614. The first delay transistor 616 is a PMOS transistor, with its gate connected to the input 702, its source connected to the first pre-driver output 612, and its drain coupled to the second pre-driver output 614. The second delay transistor 618 is a NMOS transistor, with its gate connected to the input 702, its source connected to the second pre-driver output 614, and its drain connected to the first pre-driver output 612.

The first pre-driver output 612 is connected to the gate of a third transistor 716 and the second pre-driver output 614 is connected to the gate of a fourth transistor 718. The third transistor 716 is a PMOS transistor and the fourth transistor 718 is a NMOS transistor. The source of the third transistor 716 is connected to source voltage $V_{DD}$. The drain of the third transistor 716 is connected to the output 708 and the drain of the fourth transistor 718. The source of the fourth transistor 718 is connected to ground GND.

Thus, the circuit 700 of FIG. 7 retains many of the same components of the circuit 200 of FIG. 2. However, the circuit 700 of FIG. 7 provides the advantage of reducing short current in the circuit 700 of FIG. 7. In the circuit 700 of FIG. 7, the drain of the first transistor 712 is not connected to the drain of the second transistor 714. Instead of a single pre-driver output, the circuit 700 of FIG. 7 has two pre-driver outputs 612 and 614. Thus, the drain of the first transistor 712 is connected to the first pre-driver output 612, and the drain of the second transistor 714 is connected to the second pre-driver output 614. Similarly, since there are two pre-driver outputs 612 and 614 in FIG. 7, the gate of the third transistor 716 is connected to the first pre-driver output 612 and the gate of the fourth transistor 718 is connected to the second pre-driver output 614.

In summary, the circuit 700 of FIG. 7 provides the same functionality as the circuit 200 of FIG. 2, without the disadvantage of short current $I_S$. The drains of the first and second transistors and the gates of the third and fourth transistors are not coupled together in the circuit 700 of FIG. 7. Instead, the first and third transistors have been separated from the second and fourth transistors. A pair of delay transistors 612 and 614 is connected to the input and further serves to separate the first and third transistors from the second and fourth transistors.

The circuit 700 of FIG. 7 is approximately the same size as the circuit 200 of FIG. 2. While additional transistors are included in the circuit 700 of FIG. 7, the other transistors in the circuit 700 of FIG. 7 are smaller than analogous transistors in the circuit 200 of FIG. 2. Table I, below, provides sizes for the transistors in an embodiment of circuit 200 of FIG. 2, with a preferable set of corresponding transistor sizes in an embodiment of circuit 700 of FIG. 7 that would replace the example circuit 200 of FIG. 2. The sizes in the table below are approximations, which can vary based on fabrication processes, among other factors.

TABLE I

|  | Circuit 200 Of FIG. 2 | Circuit 700 Of FIG. 7 |
| --- | --- | --- |
| First Transistor, 202 or 712 | 50 | 40 |
| Second Transistor, 204 or 714 | 25 | 20 |
| First Delay Transistor 616 | N/A | 10 |
| Second Delay Transistor 618 | N/A | 5 |
| Third Transistor, 206 or 716 | 100 | 100 |
| Fourth Transistor, 208 or 718 | 60 | 60 |

Table II, below, provides other transistor sizes for four other embodiments of the circuit 700 of FIG. 7. Again, the transistor sizes are approximations.

TABLE II

| Embodiment Number | 1 | 2 | 3 | 4 |
| --- | --- | --- | --- | --- |
| First Transistor 712 Size | 5 | 10 | 20 | 30 |
| Second Transistor 714 Size | 3 | 6 | 12 | 18 |
| First Delay Transistor 616 Size | 1.5 | 3 | 6 | 10 |
| Second Delay Transistor 618 Size | 1 | 1.5 | 3 | 5 |
| Third Transistor 716 Size | 12 | 24 | 50 | 80 |
| Fourth Transistor 718 Size | 7 | 15 | 30 | 50 |

Figure 8A:
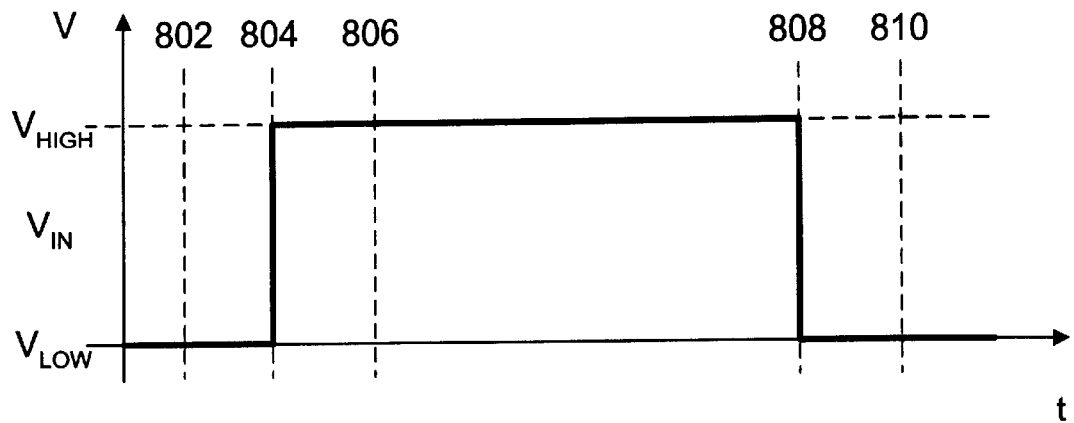
FIG. 8(a) is a graph showing the voltage at the input of the circuit of FIG. 7.
Figure 8B:
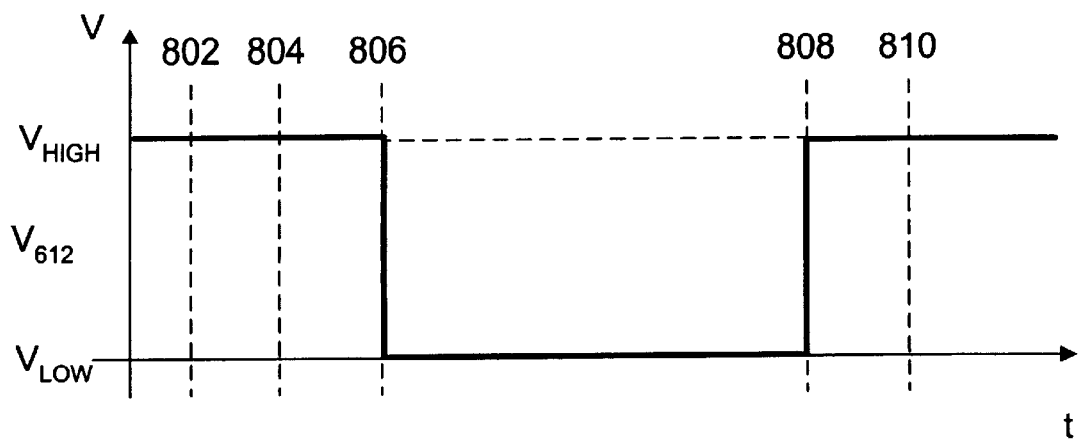
FIG. 8(b) is a graph showing the voltage at the first pre-driver output of the circuit of FIG. 7.
Figure 8C:
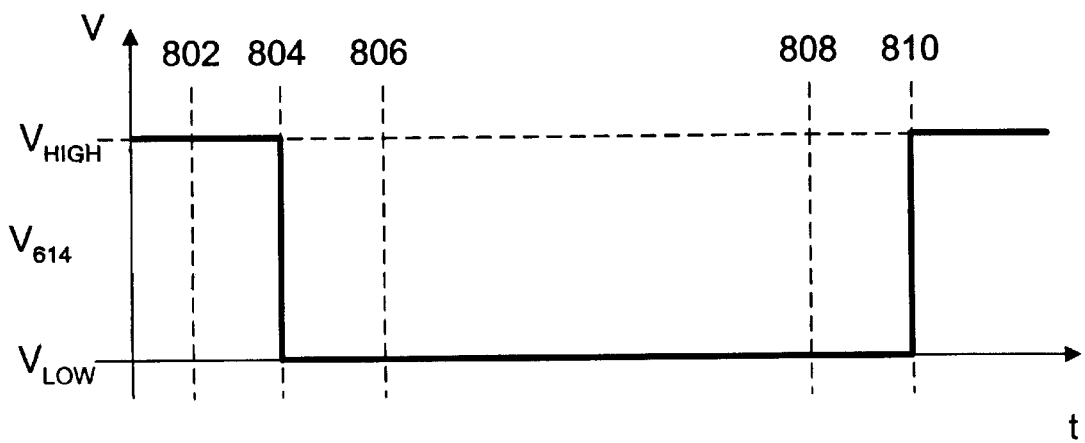
FIG. 8(c) is a graph showing the voltage at the second pre-driver output of the circuit of FIG. 7.

FIGS. 8(a) through 8(c) are graphs showing how the circuit 700 of FIG. 7 operates and reduces short current. FIG. 8(a) is a graph showing the voltage ($V_{IN}$) at the input 702, FIG. 8(b) is a graph showing the voltage at the first pre-driver output 612 ($V_{612}$), and FIG. 8(c) is a graph showing the voltage at the second pre-driver output 614 ($V_{614}$).

At a first time 802, the input voltage $V_{IN}$ is low ($V_{LOW}$). Thus, at the first time 802, the first transistor 712 is on, the second transistor 714 is off, and both the first and second pre-driver outputs 612 and 614 are at a high voltage ($V_{HIGH}$). Also, the third transistor 716 is off, and the fourth transistor 718 is on.

At time 804, the $V_{IN}$ transitions to $V_{HIGH}$. Later, at time 808, the $V_{IN}$ transitions back to $V_{LOW}$. Although the voltage transitions of $V_{IN}$, $V_{612}$, and $V_{614}$ in FIGS. 8(*a*), 8(*b*), and 8(*c*) are shown as instantaneous in order to clearly show the delay effect of the circuit, the voltage transitions occur over a period of time.

As $V_{IN}$ transitions from $V_{LOW}$ to $V_{HIGH}$, the second transistor 714 turns on, at time 804. The first transistor 712 and the first delay transistor 616 also turn off as $V_{IN}$ transitions from $V_{LOW}$ to $V_{HIGH}$ at time 804. When the second transistor 714 turns on at time 804, $V_{614}$ transitions to $V_{LOW}$, as shown in FIG. 8(*c*).

After $V_{614}$ transitions to $V_{LOW}$, the fourth transistor 718 begins to turn off. Also, the second delay transistor 618 begins to turn on.

After the second delay transistor 618 turns on, $V_{612}$ transitions to $V_{LOW}$, at time 806, as shown in FIG. 8(*b*). As $V_{612}$ transitions to $V_{LOW}$, the third transistor 716 begins to turn on.

The second delay transistor 618 does not begin to turn on until after the second transistor 714 turns on. At this time the first delay transistor 616 has turned off. Thus, the second delay transistor 618 in circuit 700 provides a delay between the transition of $V_{IN}$ and the transition in $V_{612}$. By the time $V_{612}$ transitions to $V_{LOW}$, the first transistor 712 has already turned off. Since the first transistor 712 is already off when $V_{612}$ transitions to $V_{LOW}$, short current does not flow from $V_{DD}$ to GND through transistors 712 and 714.

Similarly, the fourth transistor 718 turns off when the second delay transistor 618 turns on, and the third transistor 716 does not turn on until after the second delay transistor 618 turns on. Therefore, short current does not flow from $V_{DD}$ to GND through transistors 716 and 718.

A similar effect occurs when $V_{IN}$ transitions from $V_{HIGH}$ to $V_{LOW}$, which is shown in FIGS. 8(*a*), 8(*b*), and 8(*c*) as occurring at time 808. Just previous to time 808, $V_{IN}$ is at $V_{HIGH}$. Thus, the first transistor 712 is off, the second transistor is 714 on, and both the first and second pre-driver outputs 612 and 614 are at $V_{LOW}$. Also, the third transistor 716 is on and the fourth transistor 718 is off.

As $V_{IN}$ transitions from $V_{HIGH}$ to $V_{LOW}$, the first transistor 712 turns on, at time 808. The second transistor 714 and the second delay transistor 618 also turn off as $V_{IN}$ transitions from $V_{HIGH}$ to $V_{LOW}$ at time 808. When the first transistor 712 turns on at time 808, $V_{612}$ transitions to $V_{HIGH}$, as shown in FIG. 8(*b*).

After $V_{612}$ transitions to $V_{HIGH}$, the first delay transistor 616 begins to turn on. Also, the third transistor 716 begins to turn off.

After the first delay transistor 616 turns on, $V_{614}$ transitions to $V_{HIGH}$, at time 810, as shown in FIG. 8(*c*). As $V_{614}$ transitions to $V_{HIGH}$, the fourth transistor 718 begins to turn on.

The first delay transistor 616 does not begin to turn on until after the first transistor 712 turns on. At this time the second delay transistor 618 has turned off. Thus, the first delay transistor 616 in circuit 700 provides a delay between the transition of $V_{IN}$ and the transition in $V_{614}$. By the time $V_{614}$ transitions to $V_{HIGH}$, the second transistor 714 has already turned off. Since the second transistor 714 is already off when $V_{614}$ transitions to $V_{HIGH}$, short current does not flow from $V_{DD}$ to GND through transistors 712 and 714.

Similarly, the third transistor 716 turns off when the first delay transistor 616 turns on, and the fourth transistor 718 does not turn on until after the first delay transistor 616 turns on. Therefore, short current does not flow from $V_{DD}$ to GND through transistors 716 and 718. The circuit 700 of FIG. 7 does not have the short current $I_S$ problem.

FIGS. 9(*a*) through 9(*d*) show further embodiment circuits of the invention. The embodiments of FIGS. 9(*a*) through 9(*d*) are functionally analogous to the circuits shown in FIGS. 4(*a*) through 4(*d*), but without the disadvantage of short current.

In FIG. 9(*a*), the circuit 900 is an AND circuit with reduced short current. The AND circuit 900 of FIG. 9(*a*) retains many of the same components of the AND circuit 400 of FIG. 4(*a*). The AND circuit 900 of FIG. 9(*a*) has a first input 402 and a second input 404. The first input 402 is coupled to the gates of a pair of transistors 412 and 414. Transistor 412 is an NMOS transistor and transistor 414 is a PMOS transistor. The second input 404 is coupled to the gates of a pair of transistors 416 and 418. Transistor 416 is an NMOS transistor and transistor 418 is a PMOS transistor. Transistors 414 and 418 are connected to source voltage $V_{DD}$ and to a first pre-driver output 612. Transistor 416 is connected to ground GND and transistor 412, which is in turn connected to the second pre-driver output 614. The first pre-driver output 612 is connected to the gate of transistor 408. The second pre-driver output 614 is connected to the gate of transistor 410. Transistor 408 is also connected to source voltage $V_{DD}$ and to the output 420. Transistor 410 is also connected to ground GND and to the output 420.

Unlike the AND circuit 400 of FIG. 4(*a*), the AND circuit 900 of FIG. 9(*a*) includes two pairs of delay transistors, a first pair including the first delay transistor 616 and the second delay transistor 618, and a second pair including a third delay transistor 902 and fourth delay transistor 904. The delay transistors 616, 618, 902, and 904 are connected between the first and second pre-driver outputs 612 and 614. The first delay transistor 616 is a PMOS transistor, with its gate connected to the first input 402, its source connected to the first pre-driver output 612, and its drain coupled to the second pre-driver output 614. The second delay transistor 618 is a NMOS transistor, with its gate connected to the first input 402, its source connected to the second pre-driver output 614, and its drain connected to the first pre-driver output 612. The third delay transistor 902 is a PMOS transistor, with its gate connected to the second input 404, its source connected to the first pre-driver output 612, and its drain coupled to the second pre-driver output 614. The fourth delay transistor 904 is a NMOS transistor, with its gate connected to the second input 404, its source connected to the second pre-driver output 614, and its drain connected to the first pre-driver output 612.

Thus, transistors 414 and 418 have been separated from transistor 412 by delay transistors 616, 618, 902, and 904. Also, the gates of transistors 408 and 410 have been separated by delay transistors 616, 618, 902, and 904. The four delay transistors 616, 618, 902, and 904 act to prevent short current in the AND circuit 900 of FIG. 9(*a*) just as the delay transistors 616 and 618 act to prevent short current in the circuit 700 of FIG. 7, as discussed with regards to FIG. 8, above.

In FIG. 9(*b*), the circuit 930 is an OR circuit with reduced short current. The OR circuit 930 of FIG. 9(*b*) retains many of the same components of the OR circuit 430 of FIG. 4(*b*). The OR circuit 430 has a first input 432 and a second input 434. The first input 432 is coupled to the gates of a pair of transistors 442 and 444. Transistor 442 is a NMOS transistor and transistor 444 is a PMOS transistor. The second input 434 is coupled to the gates of a pair of transistors 446 and 448. Transistor 446 is a NMOS transistor and transistor 448 is a PMOS transistor. Transistor 444 is connected to source voltage $V_{DD}$ and to transistor 448, which is in turn connected to the first pre-driver output 612. Transistors 442 and 446 are connected to ground GND and to the second pre-driver output 614. The first pre-driver output 612 is connected to the gate of transistor 438. The second pre-driver output 614 is connected to the gate of transistor 440. Transistor 438 is also connected to source voltage $V_{DD}$ and to the output 450. Transistor 440 is also connected to ground GND and to the output 450.

Figure 4A:
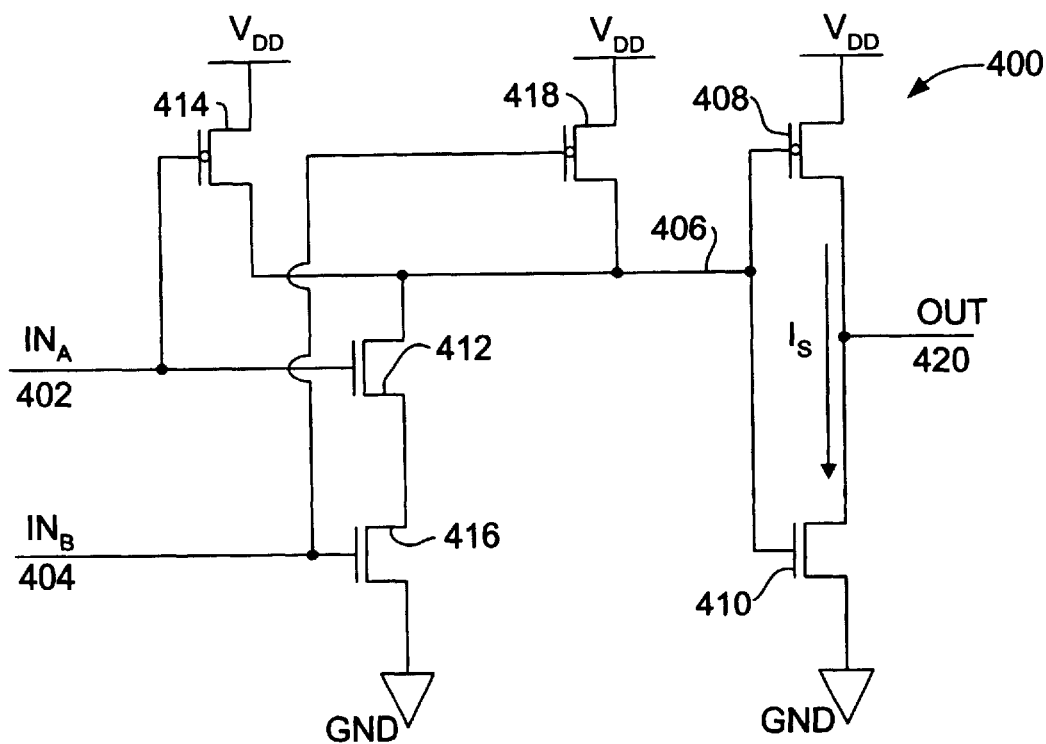
FIG. 4(a) shows a standard AND circuit that has the disadvantage of short current.
Figure 4B:
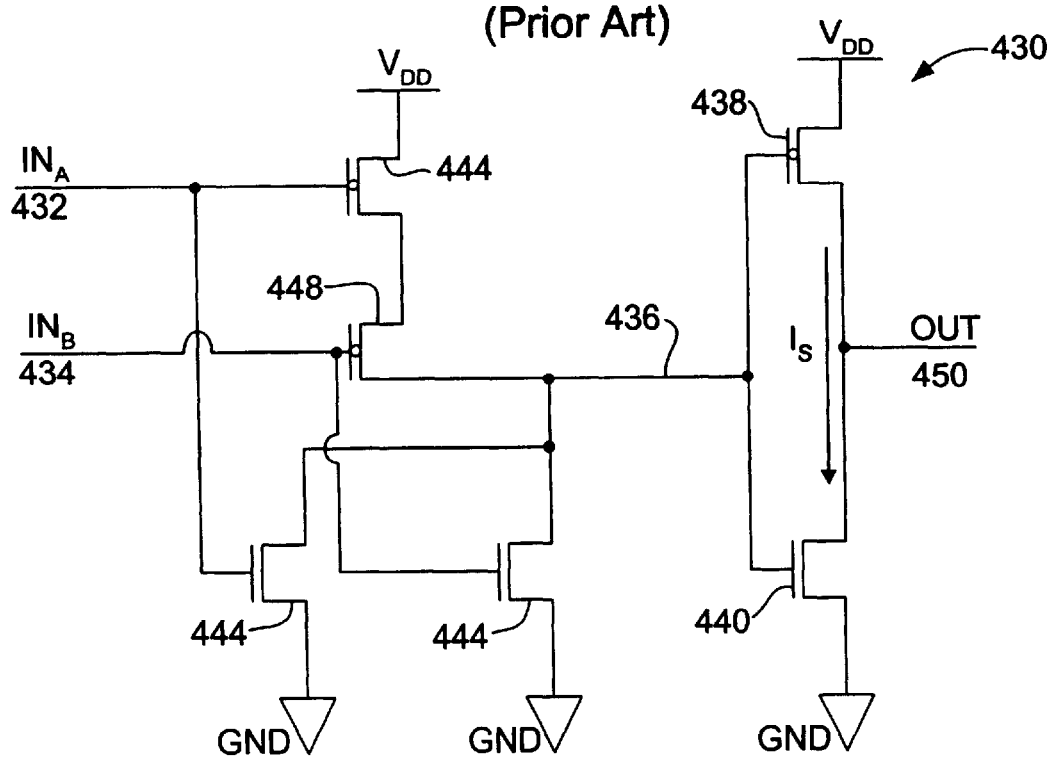
FIG. 4(b) shows a standard OR circuit that has the disadvantage of short current.
Figure 9A:
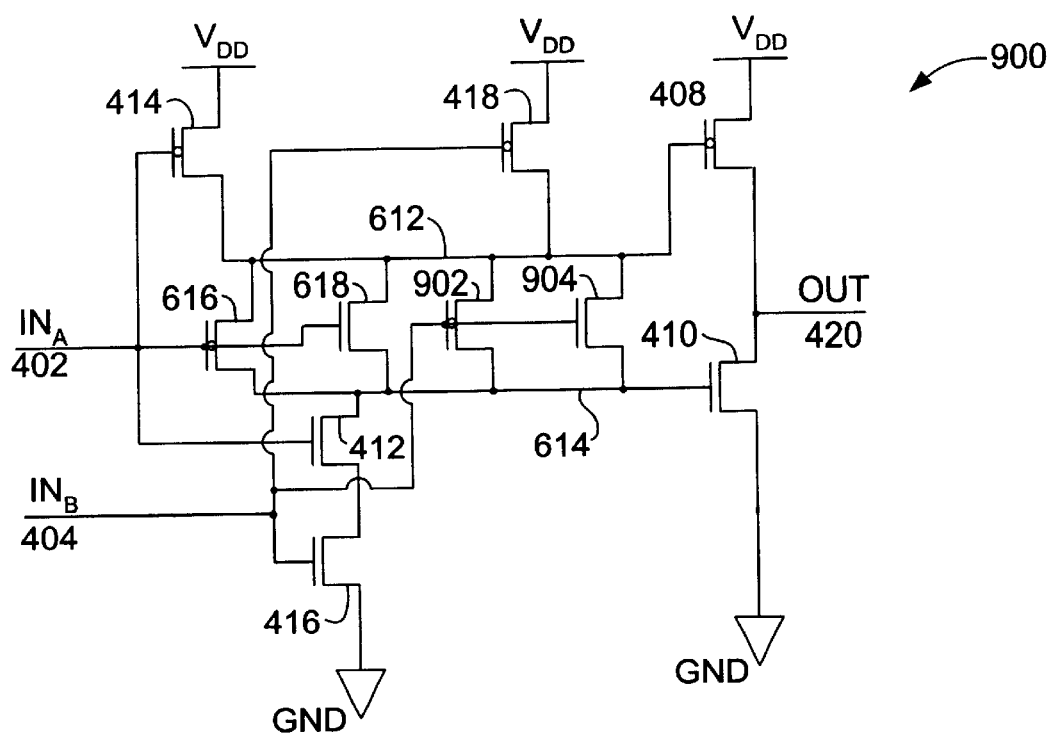
FIG. 9(a) is a schematic diagram of an AND circuit with reduced short current.
Figure 9B:
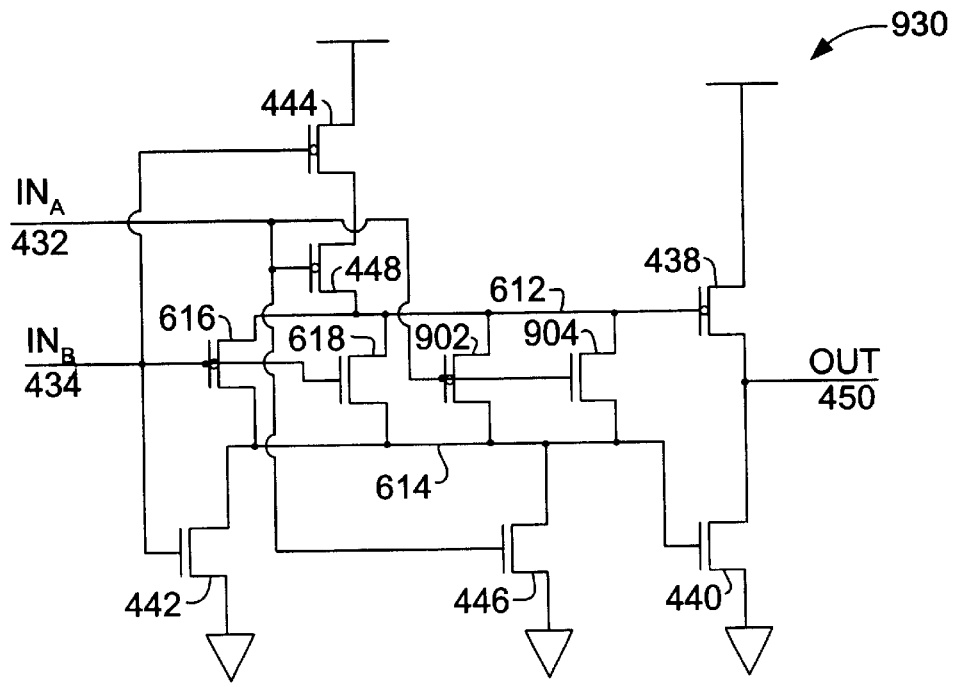
FIG. 9(b) is a schematic diagram of an OR circuit with reduced short current.

Unlike the OR circuit 430 of FIG. 4(b), the OR circuit 930 of FIG. 9(b) includes two pairs of delay transistors, a first pair including the first delay transistor 616 and the second delay transistor 618, and a second pair including the third delay transistor 902 and the fourth delay transistor 904. The delay transistors 616, 618, 902, and 904 are connected between the first and second pre-driver outputs 612 and 614. The first delay transistor 616 is a PMOS transistor, with its gate connected to the second input 434, its source connected to the first pre-driver output 612, and its drain coupled to the second pre-driver output 614. The second delay transistor 618 is a NMOS transistor, with its gate connected to the second input 434, its source connected to the second pre-driver output 614, and its drain connected to the first pre-driver output 612. The third delay transistor 902 is a PMOS transistor, with its gate connected to the first input 432, its source connected to the first pre-driver output 612, and its drain coupled to the second pre-driver output 614. The fourth delay transistor 904 is a NMOS transistor, with its gate connected to the first input 432, its source connected to the second pre-driver output 614, and its drain connected to the first pre-driver output 612.

Thus, transistors 442 and 446 have been separated from transistor 448 by delay transistors 616, 618, 902, and 904. Also, the gates of transistors 438 and 440 have been separated by delay transistors 616, 618, 902, and 904. The four delay transistors 616, 618, 902, and 904 act to prevent short current in the OR circuit 930 of FIG. 9(b) just as the delay transistors 616 and 618 act to prevent short current in the circuit 700 of FIG. 7, as discussed with regards to FIG. 8, above.

Figure 9C:
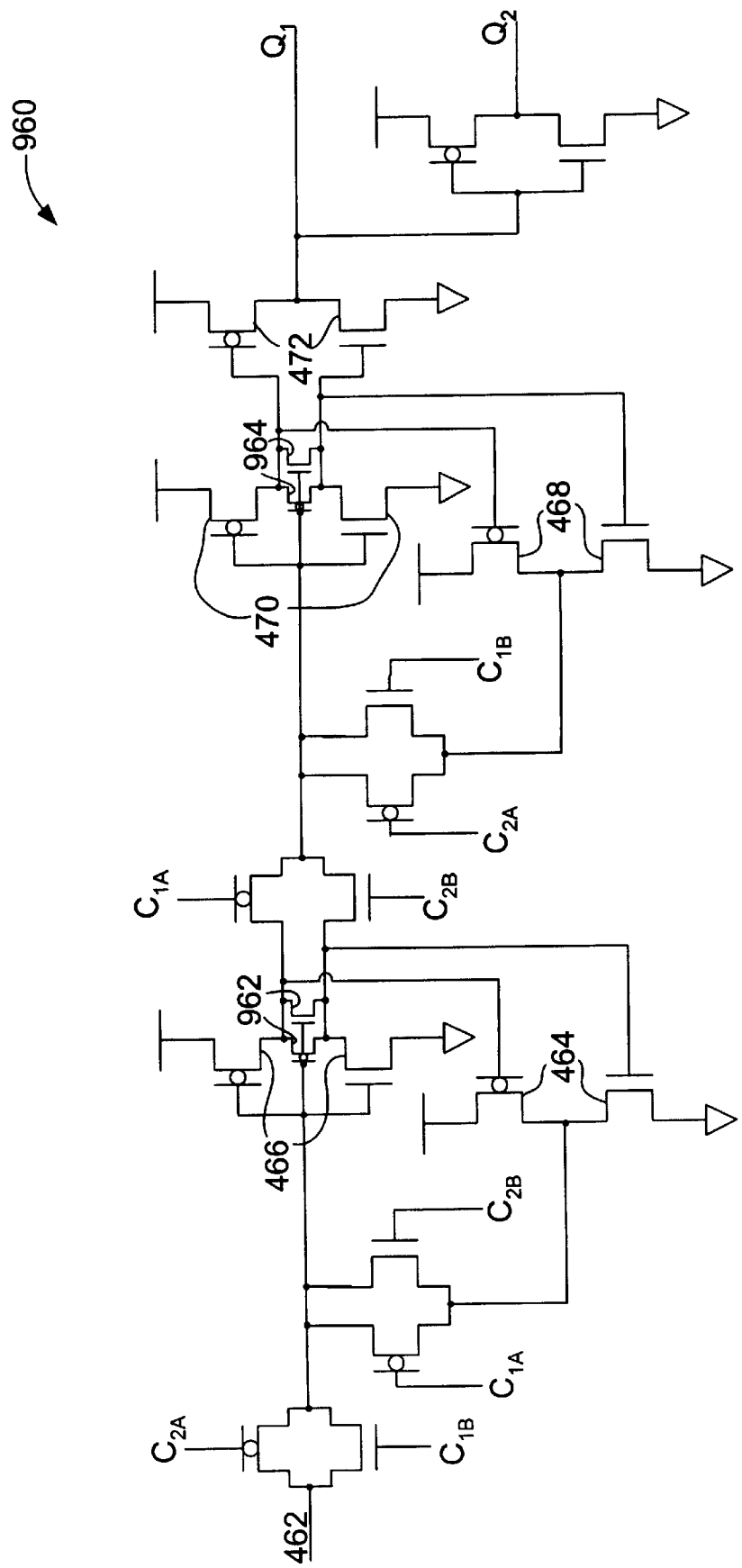
FIGS. 9(c) and 9(d) are a schematic diagram of a D latch with reduced short current.
Figure 9D:
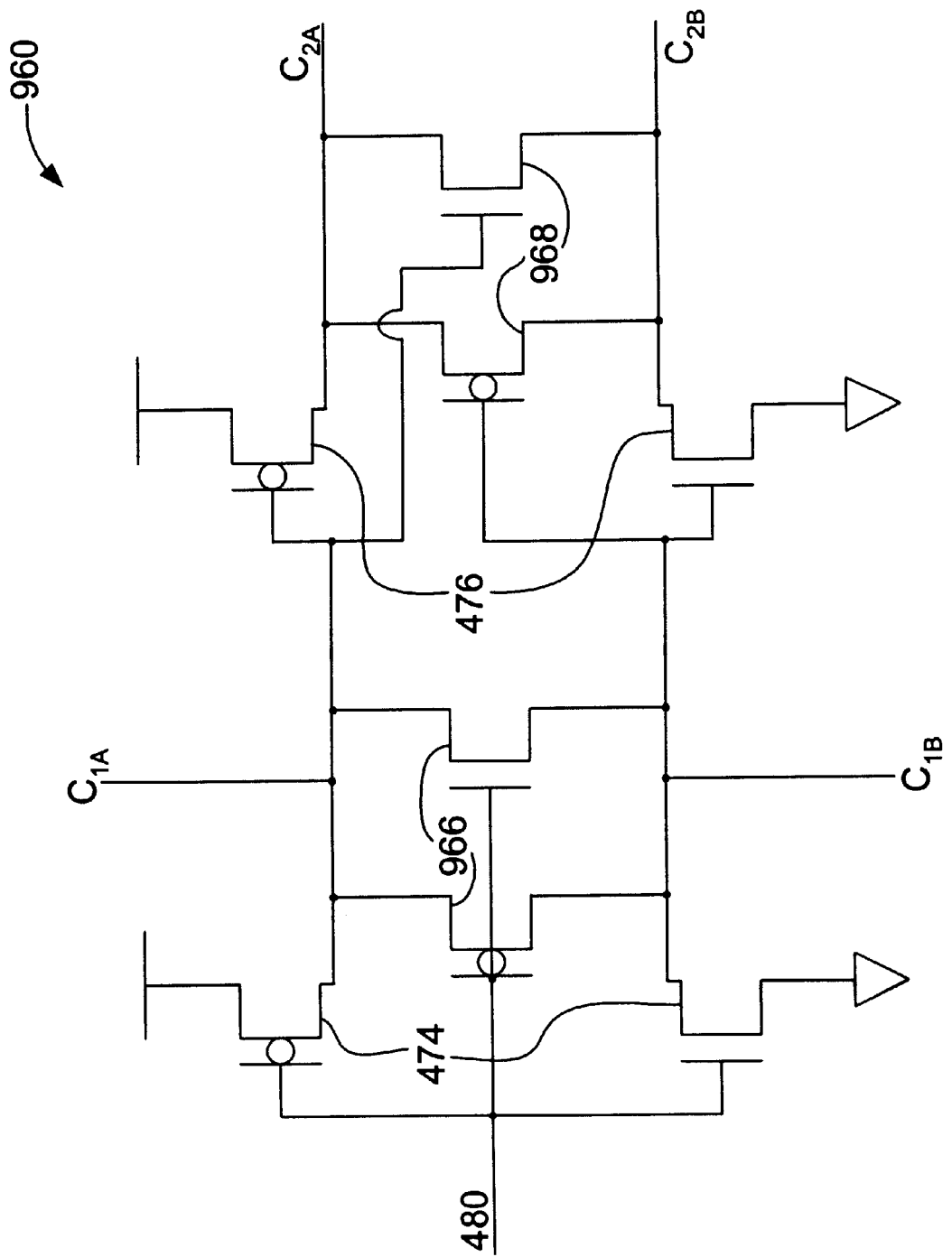

FIGS. 9(c) and 9(d) are a schematic diagram of a D latch 960 with reduced short current. The D latch 960 of FIGS. 9(c) and 9(d) retains many of the same components of the D latch 460 of FIGS. 4(c) and 4(d). The D latch 960 has two inputs, a data input 462 and a clock input 480, and two outputs, $Q_1$ and $Q_2$. The clock input 480 is shown in FIG. 9(d).

The portion of the D latch 960 shown in FIG. 9(d) receives the clock input 480 and produces outputs $C_{1A}$, $C_{1B}$, $C_{2A}$, and $C_{2B}$, which are connected to the rest of the D latch 960 at the locations indicated in FIG. 9(c).

Figure 4C:
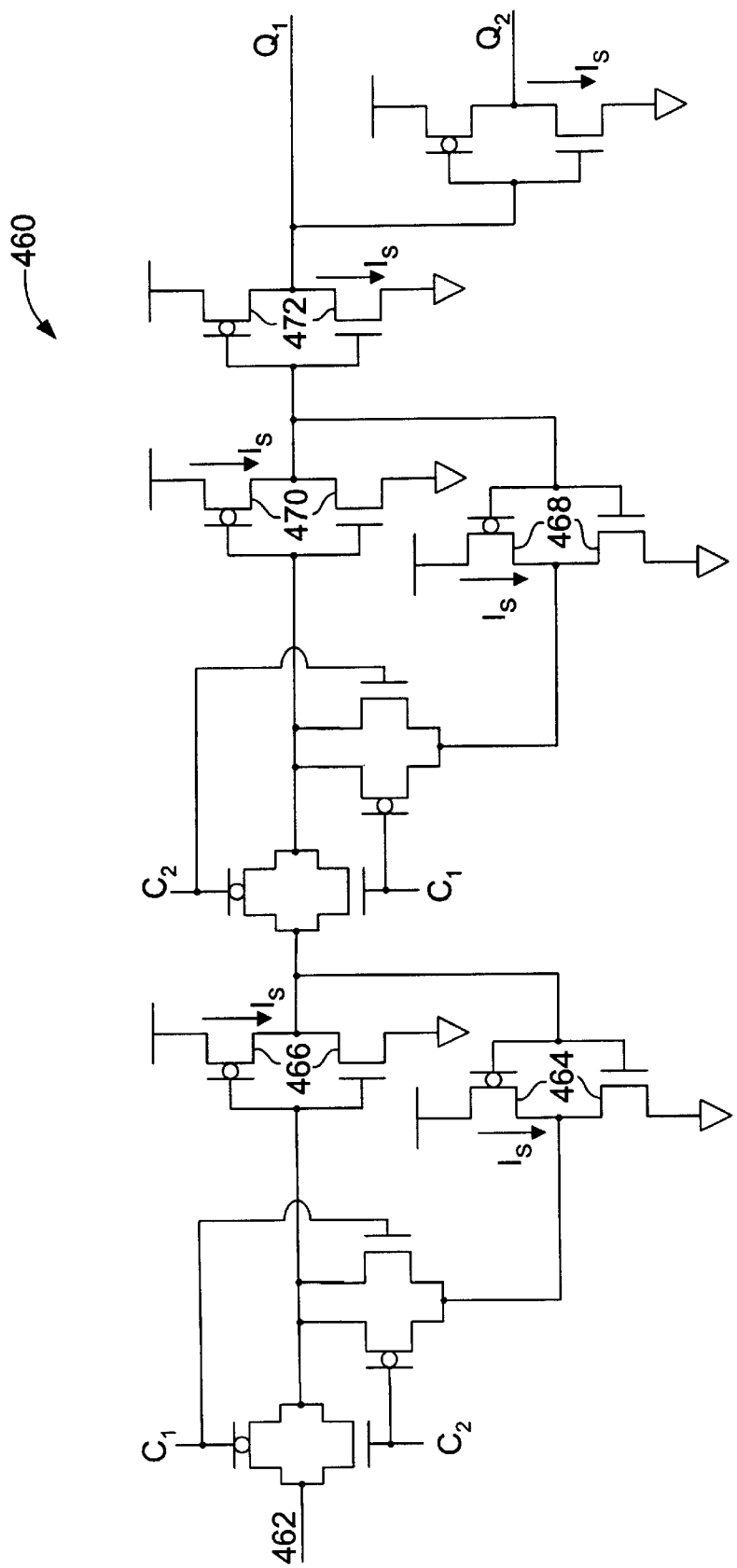
FIGS. 4(c) and 4(d) show a standard D latch circuit that has the disadvantage of short current.
Figure 4D:
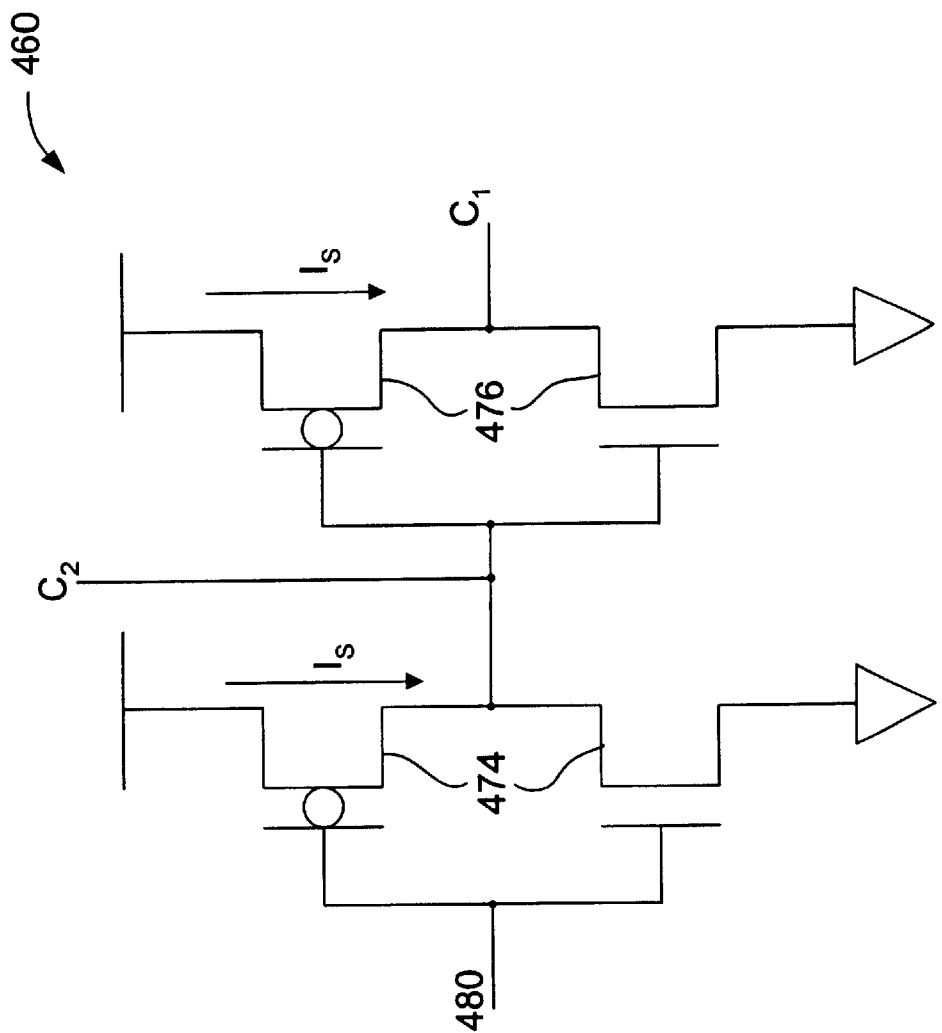
Figure 5:
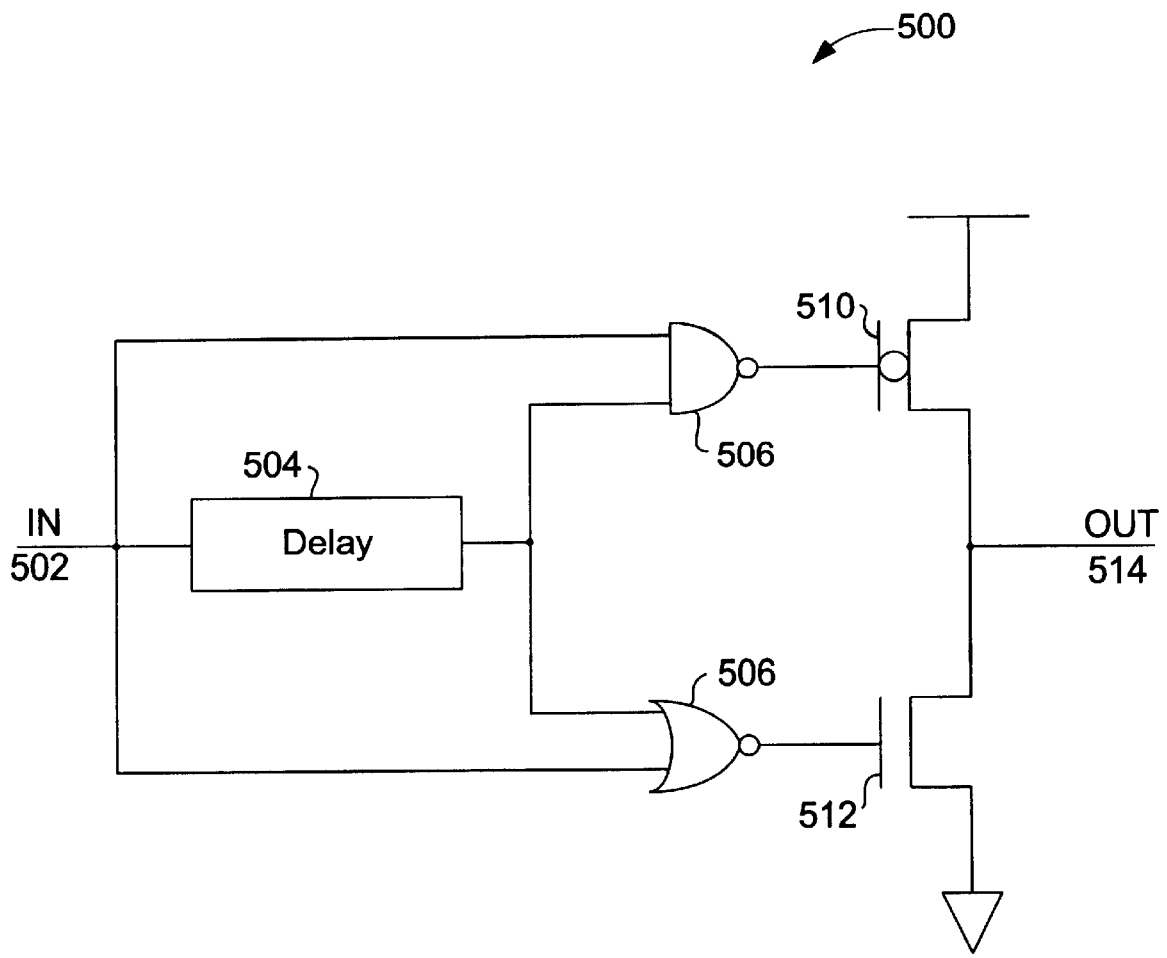
FIG. 5 is a block diagram of a previous circuit without short current.

Unlike the D latch 460 of FIGS. 4(c) and 4(d), the D latch 960 of FIGS. 9(c) and 9(d) includes pairs of delay transistors 962, 964, 966, and 968. These delay transistors 962, 964, 966, and 968 separate transistor pairs 464, 466, 468, 470, 472, 474, and 476 and act to prevent short current in the D latch 960 of FIGS. 9(c) and 9(d) just as the delay transistors 616 and 618 act to prevent short current in the circuit 700 of FIG. 7, as discussed with regards to FIG. 8, above.

Thus, by separating pairs of transistors, which would otherwise be connected together and suffer from short current, with pairs of delay transistors the problem of short current is reduced.

While the invention has been particularly shown and described with reference to a preferred embodiment and several alternate embodiments, it will be understood by persons skilled in the relevant art that various changes in form and details can be made therein without departing from the spirit and scope of the invention.

I claim:

1. A reduced short-current circuit comprising:
   a pre-driver circuit;
   a first pre-driver input;
   a second pre-driver input;
   a first pre-driver output;
   a second pre-driver output; and
   a first delay pair, comprising:
   a first transistor having a gate directly coupled to the first pre-driver input, a source directly coupled to the first pre-driver output, and a drain directly coupled to the second pre-driver output; and
   a second transistor having a gate directly coupled to the first pre-driver input, a drain directly coupled to the first pre-driver output, and a source directly coupled to the second pre-driver output; and
   a second delay pair, comprising:
   a third transistor having a gate directly coupled to the second pre-driver input, a source directly coupled to the first pre-driver output, and a drain directly coupled to the second pre-driver output; and
   a fourth transistor, having a gate directly coupled to the second pre-driver input, a drain directly coupled to the first pre-driver output, and a source directly coupled to the second pre-driver output.

2. The circuit of claim 1, further comprising a driver circuit coupled to the first pre-driver output and the second pre-driver output, the driver circuit having a driver output.

3. The circuit of claim 1, the pre-driver circuit comprising a fifth transistor and a sixth transistor, the fifth transistor and the sixth transistor being directly coupled to the first pre-driver input, the fifth transistor being directly coupled to the first pre-driver output, and the sixth transistor being directly coupled to the second pre-driver output.

4. The circuit of claim 3, further comprising a driver circuit, the driver circuit comprising a seventh transistor, an eighth transistor, and a driver circuit output, the seventh transistor being directly coupled to the first pre-driver output, the eighth transistor being directly coupled to the second pre-driver output.

5. A reduced short-current circuit comprising:
   a first transistor;
   a second transistor;
   a third transistor;
   a fourth transistor;
   a fifth transistor;
   a sixth transistor;
   a seventh transistor;
   an eighth transistor;
   a ninth transistor;
   a tenth transistor;
   a first pre-driver input directly coupled to the first transistor, the second transistor, the third transistor, and the fourth transistor;
   a second pre-driver input directly coupled to the seventh transistor, the eighth transistor, the ninth transistor, and the tenth transistor;
   a first pre-driver output directly coupled to the first transistor, the second transistor, the third transistor, the fifth transistor, the seventh transistor, the ninth transistor and the tenth transistor;

a second pre-driver output directly coupled to the second transistor, the third transistor, the fourth transistor, the sixth transistor, the ninth transistor, and the tenth transistor; and a first driver output, directly coupled to the fifth transistor and the sixth transistor.

6. The circuit of claim 5 wherein:

the first transistor has a gate, a source and a drain;

the second transistor has a gate, a source and a drain;

the third transistor has a gate, a source and a drain;

the fourth transistor has a gate, a source and a drain;

the fifth transistor has a gate, a source and a drain;

the sixth transistor has a gate, a source and a drain;

the seventh transistor has a gate, a source and a drain;

the eighth transistor has a gate, a source and a drain;

the ninth transistor has a gate, a source and a drain;

the tenth transistor has a gate, a source and a drain;

the first pre-driver input is directly coupled to the gate of the first transistor, the gate of the second transistor, the gate of the third transistor, and the gate of the fourth transistor;

the second pre-driver input is directly coupled to the gate of the seventh transistor, the gate of the eighth transistor, the gate of the ninth transistor, and the gate of the tenth transistor;

the first pre-driver output is directly coupled to the gate of the fifth transistor; and the second pre-driver output is directly coupled to the gate of the sixth transistor.

7. The circuit of claim 6 wherein:

the drain of the eighth transistor is directly coupled to the source of the fourth transistor;

the first pre-driver output is directly coupled to the drain of the first transistor, the source of the second transistor, the drain of the third transistor, the drain of the seventh transistor, the source of the ninth transistor, and the drain of the tenth transistor;

the second pre-driver output is directly coupled to the drain of the fourth transistor, the source of the third transistor, the drain of the second transistor, the drain of the ninth transistor, and the source of the tenth transistor; and the first driver output is directly coupled to the drain of the fifth transistor and the drain of the sixth transistor.

8. The circuit of claim 7 wherein:

the first transistor, the second transistor, the fifth transistor, the seventh transistor, and the ninth transistor are PMOS transistors;

the third transistor, the fourth transistor, the sixth transistor, the eighth transistor, and the tenth transistor are NMOS transistors.

9. The circuit of claim 7 wherein:

the source of the first transistor, the source of the fifth transistor, and the source of the seventh transistor are directly coupled to a voltage source; and the source of the eighth transistor and the source of the sixth transistor are directly coupled to ground.

10. A reduced short-current circuit comprising:

a first transistor with a gate, a source, and a drain;

a second transistor with a gate, a source, and a drain, the gate of the second transistor being directly connected to the gate of the first transistor;

a third transistor with a gate, a source, and a drain, the source of the third transistor being directly connected to the drain of the first transistor, the drain of the third transistor being directly connected to the drain of the second transistor, and the gate of the third transistor being directly connected to the gate of the first transistor and the gate of the second transistor;

a fourth transistor with a gate, a source, and a drain, the drain of the fourth transistor being directly connected to the drain of the first transistor, the source of the fourth transistor being directly connected to the drain of the second transistor, and the gate of the fourth transistor being directly connected to the gate of the first transistor, the gate of the second transistor, and the gate of the third transistor;

a fifth transistor with a gate, a source, and a drain, the drain of the fifth transistor being directly connected to the source of the second transistor;

a sixth transistor with a gate, a source, and a drain, the drain of the sixth transistor being directly connected to the drain of the first transistor, the source of the third transistor, and the drain of the fourth transistor, and the gate of the sixth transistor being directly connected to the gate of the fifth transistor;

a seventh transistor with a gate, a source, and a drain, the drain of the seventh transistor being directly connected to the drain of the second transistor, the drain of the third transistor, and the source of the fourth transistor, the source of the seventh transistor being directly connected to the drain of the first transistor, the source of the third transistor, the drain of the fourth transistor, and the drain of the sixth transistor, and the gate of the seventh transistor being directly connected to the gate of the fifth transistor and the gate of the sixth transistor; and an eighth transistor with a gate, a source, and a drain, the drain of the eighth transistor being directly connected to the drain of the first transistor, the source of the third transistor, the drain of the fourth transistor, and the drain of the sixth transistor, the source of the eighth transistor being directly connected to the drain of the second transistor, the drain of the third transistor, the source of the fourth transistor and the drain of the seventh transistor, and the gate of the eighth transistor being directly connected to the gate of the fifth transistor, the gate of the sixth transistor, and the gate of the seventh transistor.

11. A reduced short-current circuit comprising:

a first transistor with a gate, a source, and a drain;

a second transistor with a gate, a source, and a drain, the drain of the second transistor being directly connected to the drain of the first transistor;

a third transistor with a gate, a source, and a drain, the source of the third transistor being directly connected to the gate of the first transistor, and the drain of the third transistor being directly connected to the gate of the second transistor;

a fourth transistor with a gate, a source, and a drain, the drain of the fourth transistor being directly connected to the gate of the first transistor, the source of the fourth transistor being directly connected to the gate of the second transistor, and the gate of the fourth transistor being directly connected to the gate of the third transistor a fifth transistor with a gate, a source, and a drain, the drain of the fifth transistor being directly connected to the gate of the second transistor, the drain of the third transistor, and the source of the fourth transistor, and the source of the fifth transistor being directly connected to the gate of the first transistor, the source of the third transistor, and the drain of the fourth transistor; and a sixth transistor with a gate, a source, and a drain, the drain of the sixth transistor being directly connected to the gate of the first transistor, the source of the third transistor, the drain of the fourth transistor, and the source of the fifth transistor, the source of the sixth transistor being directly connected to the gate of the second transistor, the drain of the third transistor, the source of the fourth transistor, and the drain of the fifth transistor, and the gate of the sixth transistor being directly connected to the gate of the fifth transistor.

* * * * *